United States Patent
Masui et al.

(10) Patent No.: US 9,579,794 B2
(45) Date of Patent: Feb. 28, 2017

(54) ARTICULATED ROBOT AND METHOD FOR CONTROLLING THE SAME

(71) Applicant: SINFONIA TECHNOLOGY CO., LTD., Tokyo (JP)

(72) Inventors: Yoji Masui, Tokyo (JP); Toru Saeki, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 42 days.

(21) Appl. No.: 14/798,673

(22) Filed: Jul. 14, 2015

(65) Prior Publication Data

US 2016/0184987 A1 Jun. 30, 2016

(30) Foreign Application Priority Data

Dec. 25, 2014 (JP) .................................. 2014-263215

(51) Int. Cl.
*G06F 19/00* (2011.01)
*B25J 9/16* (2006.01)
*H01L 21/677* (2006.01)

(52) U.S. Cl.
CPC ...... *B25J 9/1664* (2013.01); *H01L 21/67766* (2013.01); *Y10S 901/02* (2013.01)

(58) Field of Classification Search
CPC ...... B25J 9/1664; B25J 9/1666; B25J 9/1669; B25J 9/1676; B25J 9/1687; B25J 9/1684; B25J 15/00; B25J 11/0095; H01L 21/67766; H01L 21/67769; H01L 21/67778; H01L 21/67; Y10S 901/02; Y10S 901/08; Y10S 901/09; Y10S 901/14; Y10S 901/15; Y10S 901/19

USPC ............................................... 700/245; 901/2
See application file for complete search history.

(56) References Cited

U.S. PATENT DOCUMENTS

| | | | | |
|---|---|---|---|---|
| 6,502,054 | B1 * | 12/2002 | Mooring | G05B 19/4083 702/149 |
| 9,081,306 | B2 * | 7/2015 | Kao | G03F 7/20 |
| 9,346,171 | B2 * | 5/2016 | Watanabe | B25J 9/107 |
| 2004/0249509 | A1 * | 12/2004 | Rogers | B25J 9/1664 700/245 |

(Continued)

FOREIGN PATENT DOCUMENTS

JP         2011-167827 A         9/2011

*Primary Examiner* — Jaime Figueroa
(74) *Attorney, Agent, or Firm* — Westerman, Hattori, Daniels & Adrian, LLP

(57) ABSTRACT

An articulated robot comprises a control unit including: a track information storage unit which stores track information corresponding to a combination of a start point and an end point; a setting unit which sets a current position and a target position of an arm distal end as the start point and the end point; and an operation command generation unit which generates an operation command based on track information corresponding to a combination of the set start point and the set end point (corresponding track information). If the corresponding track information is not stored but related track information corresponding to a combination of a start point and an end point having a predetermined relationship with a combination of the set start point and the set end point is stored in the track information storage unit, the operation command generation unit generates the operation command based on the related track information.

9 Claims, 6 Drawing Sheets

(56) References Cited

U.S. PATENT DOCUMENTS

| | | | |
|---|---|---|---|
| 2010/0161124 A1* | 6/2010 | Kimura | B25J 9/1666 700/251 |
| 2010/0209225 A1* | 8/2010 | Matsuo | H01L 21/67745 414/744.5 |
| 2014/0140801 A1* | 5/2014 | Sueyoshi | B25J 9/042 414/744.6 |

* cited by examiner

Fig. 4A

| OPERATION ORDER | AXIS 1 | AXIS 2 | AXIS 3 | |
|---|---|---|---|---|
| 1 | $\theta 1(1)$ | $\theta 2(1)$ | $\theta 3(1)$ | ) A |
| 2 | $\theta 1(2)$ | $\theta 2(2)$ | $\theta 3(2)$ | ) A |
| 3 | $\theta 1(3)$ | $\theta 2(3)$ | $\theta 3(3)$ | ) A |
| ... | ... | ... | ... | ) A |
| 8 | $\theta 1(8)$ | $\theta 2(8)$ | $\theta 3(8)$ | ) A |
| 9 | $\theta 1(9)$ | $\theta 2(9)$ | $\theta 3(9)$ | ) A |
| 10 | $\theta 1(10)$ | $\theta 2(10)$ | $\theta 3(10)$ | ) A |

| | | START POINT | | | |
|---|---|---|---|---|---|
| | | P0 | P1 | P2 | ... |
| END POINT | P0 | | — | — | ... |
| | P1 | R1 (=Rc(0,1)) (=Ri(1,0)) | | — | ... |
| | P2 | R2 (=Rc(0,2)) (=Ri(2,0)) | R3 (=Rc(1,2)) (=Ri(2,1)) | | ... |
| | ... | ... | ... | ... | ... | ic robot and a method for controlling an articulated
ARTICULATED ROBOT AND METHOD FOR CONTROLLING THE SAME

CROSS-REFERENCE TO RELATED APPLICATIONS

This application claims priority of Japanese Patent Application No. 2014-263215 filed on Dec. 25, 2014. The contents of the applications are incorporated herein by reference in their entirety.

BACKGROUND OF THE INVENTION

1. Field of the Invention

The present invention relates to an articulated robot of which arm distal end is operated using preset track information, and a method for controlling the articulated robot.

2. Description of the Related Art

There has been an articulated robot of which arm constituted by a plurality of rotatably connected arm elements is driven to move an arm distal end to a predetermined position.

For example, a conveying apparatus that is a kind of an articulated robot described in Japanese Laid-Open Patent Publication No. 2011-167827 performs movement control of an arm distal end using track information generated in advance by a track information generating apparatus. Here, track information used for the movement control is generated based on a dynamics model of the arm so that moving time from a desired start point to a desired end point may be the shortest using an optimization technique.

Another articulated robot calculates in real time a path that interpolates between two given points with a straight line or a circular arc and performs driving control based on the calculated data instead of holding track information for driving in advance.

In a case where the track information po is generated in advance, the generated track information needs to be stored in a storage, and storage capacity of the storage must be increased to increase the number of tracks that the arm distal end of the articulated robot may follow. In a case where the track information is generated in advance, track calculation time for generating tracks is required, when the articulated robot is set up, depending on the number of pieces of track information to generate.

In a case where the conveyance path is calculated in real time, a relay point needs to be set by, for example, a teaching operation to connect the start point to the end point by a combination of a straight line or a circular arc, which is a time-consuming process. Further, even a skilled person has difficulty in setting a relay point that passes through an optimum path in consideration of many constraints, such as torque, the number of rotation, an angle, and acceleration of each axis. Further, since the articulated robot needs to perform interpolating calculation of the relay point, load is applied to a control unit of the robot.

SUMMARY OF THE INVENTION

The present invention is made in view of the aforementioned problems and an object thereof is to provide an articulated robot and a method for controlling an articulated robot capable of suitably performing position control of an arm distal end without increasing storage capacity, capable of reducing a teaching operation necessary for calculating a conveyance path in real time, and capable of shortening track calculation time necessary for deriving track information for the position control.

The following measures have been devised as the present invention to achieve the above object.

An articulated robot according to the present invention is an articulated robot including: an arm constituted by a plurality of rotatably connected arm elements; and a control unit configured to perform position control of an arm distal end by outputting an operation command to a driving unit that drives the arm elements, wherein the control unit includes a track information storage unit configured to store track information that corresponds to a combination of which any of a plurality of destinations to which the arm distal end is moved is set to be a start point and any other of the destinations is set to be an end point, and that includes position information of each of the arm elements arranged in time series, a setting unit configured to set a current position and a target position of the arm distal end as the start point and the end point, and an operation command generation unit configured to generate the operation command based on the track information corresponding to the combination of the start point and the end point set by the setting unit, and wherein, if the track information corresponding to the combination of the start point and the end point set by the setting unit is not stored but related track information corresponding to a combination of a start point and an end point having a predetermined relationship with the combination of the start point and the end point set by the setting unit is stored in the track information storage unit, the operation command generation unit generates the operation command based on the related track information.

With this configuration, the track information storage unit stores the track information that includes the position information of each of the arm elements set in time series, and the operation command generation unit outputs the operation command based on the track information corresponding to the start point and the end point set by the setting unit to perform position control of the arm distal end. Therefore, if the track information is prepared once, that information can be shared by the articulated robots of the same configuration, and thus adjustment of the relay point becomes unnecessary. Since the operation command is generated from the track information stored in the track information storage unit, real-time calculation, such as interpolating calculation of the relay point, becomes unnecessary, and an appropriate operation command can be generated even by a low specification calculator. Further, a teaching operation necessary for the calculation of the conveyance path in real time can be reduced. If the track information corresponding to the combination of the start point and the end point set by the setting unit is not stored but related track information corresponding to a combination of a start point and an end point having a predetermined relationship with the combination of the start point and the end point set by the setting unit is stored, the operation command is generated based on the related track information. Thus, the track information to store in the track information storage unit can be reduced, and position control of the arm distal end can be performed without providing a large-capacity storage. Further, by reducing the track information, more operation commands can be generated using the storage of the same capacity. In addition, track calculation time necessary for deriving the track information can be shortened.

As a configuration to reduce the track information stored in the track information storage unit, it is desirable that the related track information includes inverted track information that is track information corresponding to a combination of which the start point and the end point set by the setting unit are inverted, and that the operation command generation unit is capable of generating the operation command by using the inverted track information in inverted time series.

As another configuration to reduce the track information stored in the track information storage unit, it is effective that the related track information includes symmetry track information that is the track information corresponding to a combination of a start point and an end point located at symmetrical positions about a straight line passing through a center of rotation of the arm with respect to the start point and the end point set by the setting unit, and that the operation command generation unit is capable of generating the operation command by using the symmetrically transformed position information of the symmetry track information.

Further, to enable to reduce the track information to store in the track information storage unit in a case where the articulated robot is provided with a first hand and a second hand as the arm elements, it is effective that, on the opposite side of the base end of the arm, a first hand and a second hand as the arm elements are provided rotatably about the same rotation axis, that the control unit performs position control of a first hand distal end and a second hand distal end that form the arm distal end, and that the operation command generation unit generates the operation command used to perform position control of the first hand distal end and the second hand distal end based on the track information stored in the track information storage unit.

A method for controlling an articulated robot according to the present invention is a method for controlling an articulated robot that includes: an arm constituted by a plurality of rotatably connected arm elements, a driving unit configured to drive the arm elements, and a track information storage unit configured to store track information corresponding to a combination of which any of a plurality of destinations to which the arm distal end is moved is set to be a start point and any other of the destinations is set to be an end point, in which position control of the arm distal end is performed by outputting the operation command to the driving unit, the method including: a step of setting a start point and an end point based on current position information and target position information; a step of determining whether track information corresponding to the combination of the set start point and the set end point is stored in the track information storage unit; a step of generating an operation command based on the track information if it is determined that the track information exists in the track information storage unit; a step of determining whether related track information corresponding to a combination of a start point and an end point having a predetermined relationship with the combination of the start point and the end point is stored in the track information storage unit if it is determined that the track information is not stored in the track information storage unit; and a step of generating the operation command based on the related track information if it is determined that the related track information is stored in the track information storage unit. This invention may provide the same effects as those described above.

According to the present invention described above, it is possible to provide an articulated robot and a method for controlling an articulated robot capable of suitably performing position control of an arm distal end without increasing storage capacity, capable of reducing a teaching operation necessary for calculating a conveyance path in real time, and capable of shortening track calculation time necessary for deriving track information for the position control.

BRIEF DESCRIPTION OF DRAWINGS

FIGS. 4A and 4B are diagrams illustrating time series data of position information of the articulated robot.

DESCRIPTION OF THE PREFERRED EMBODIMENTS

An articulated robot according to an embodiment of the present invention will be described below with reference to the drawings.

Figure 1:
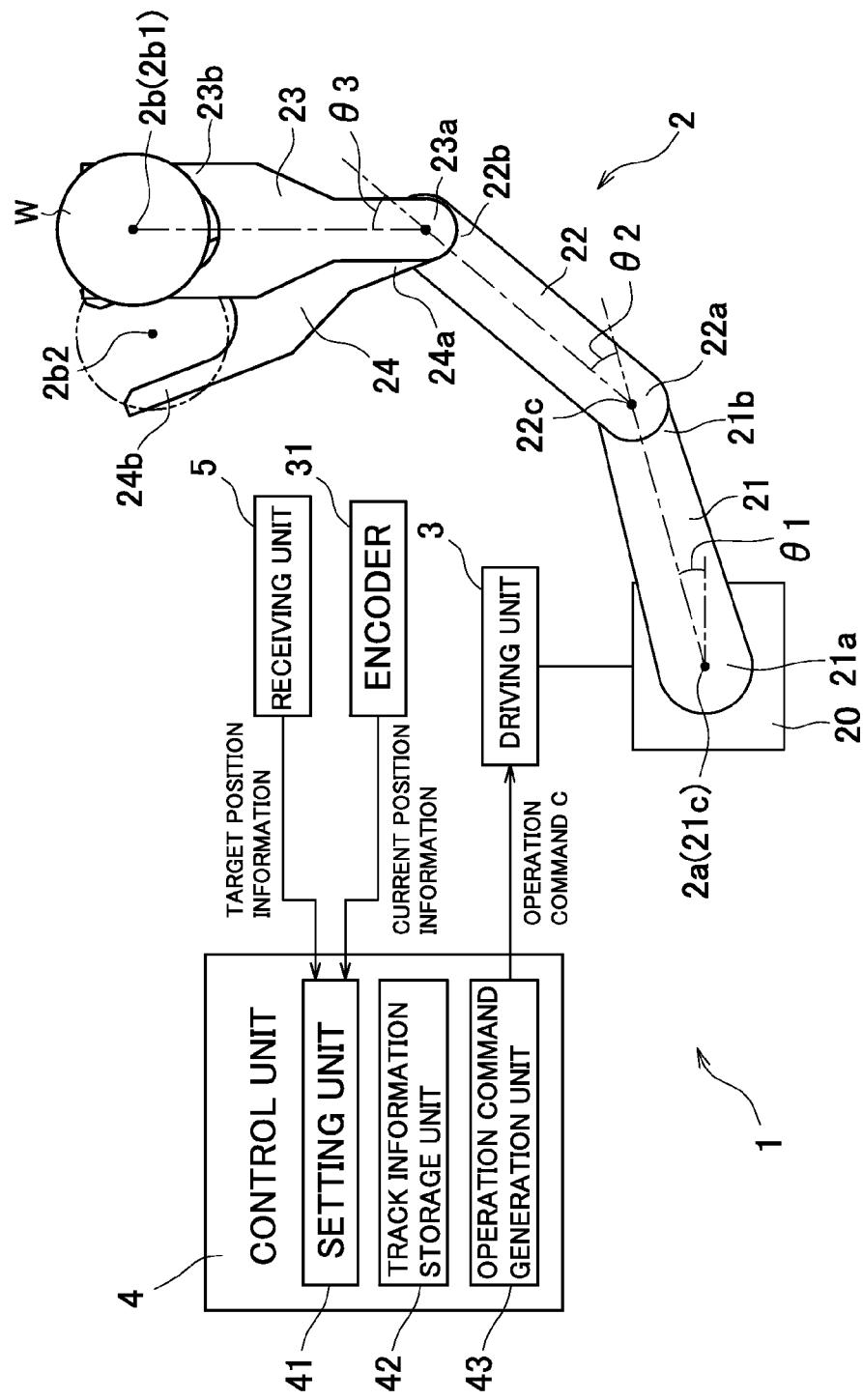
FIG. 1 is a configuration diagram schematically illustrating an articulated robot according to an embodiment of the present invention.

As illustrated in FIG. 1, the articulated robot of the present embodiment is a conveying apparatus 1 that conveys a wafer W, a conveyed material, and consists of an arm 2, a driving unit 3 that drives the arm 2, a control unit 4 that controls driving of the arm 2, and a receiving unit 5 that receives a target position at which the wafer W is delivered.

Figure 2:
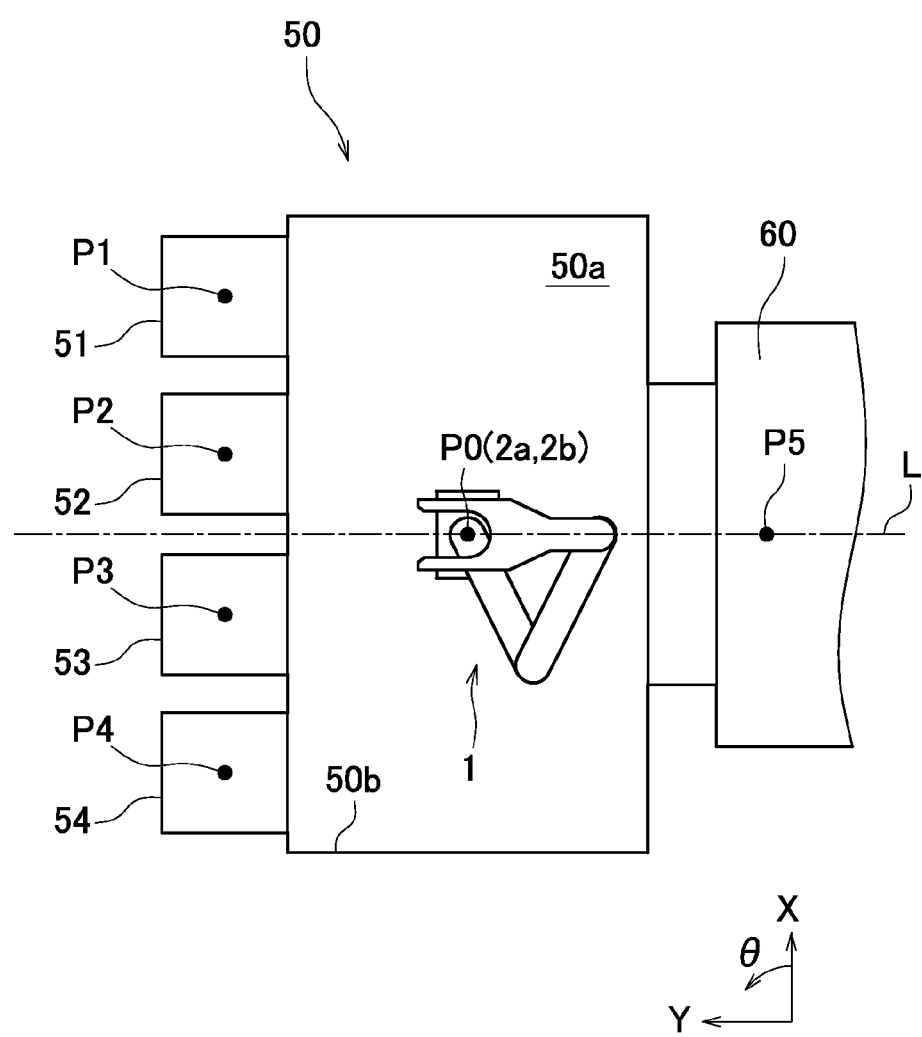
FIG. 2 is a plan view illustrating an example of a destination of the articulated robot in an EFEM.

As illustrated in FIG. 2, the conveying apparatus 1 is installed inside a conveyance chamber 50a of an equipment front end module (EFEM) 50 provided with a plurality of load ports 51 to 54. These load ports 51 to 54 and load lock chambers 60 and the like disposed adjacent to the EFEM 50 are set to be base points P1 to P5, which are predetermined destinations of the wafer W. Further, an initial position of an arm distal end 2b immediately after the conveying apparatus 1 is started (that coincides with an arm base end 2a) is set to be a base point P0.

In the following description, a direction in which the load ports 51 to 54 are arranged is defined as an X-axis direction, a direction that perpendicularly crosses the X-axis direction and a vertical direction is defined as a Y-axis direction, and an angle θ is defined counterclockwise to the X-axis. In the present application, when seen as a plan view, the EFEM 50 is line symmetrical about an axis of symmetry L, which is a straight line parallel to the Y-axis and passing through the arm base end 2a that is the center of rotation of the arm 2.

As illustrated in FIG. 1, the arm 2 is provided with a first arm element 21 of which base end portion 21a is connected to a base 20, a second arm element 22 of which base end 22a is connected to an end portion 21b of the first arm element 21, and a first hand 23 and a second hand 24 as a third arm element and a fourth arm element of which base ends 23a and 24a are connected to an end portion 22b of the second arm element 22, and are provided with holding portions 23b and 24b for mounting the wafer W at distal ends thereof, and each of the arm elements 21 to 24 are connected rotatably in a horizontal direction about axes 21c to 23c. Since the first hand 23 and the second hand 24 are the same in configuration, only the first hand 23 will be described below. A central position of the wafer W when the holding portion 23b holds the wafer W is defined as the arm distal end 2b.

The driving unit 3 is provided with servomotors (not illustrated) each of which is provided at each of the base end portions 21a to 23a of the arm elements 21 to 23. When each servomotor is driven, an angle θ1 between the base 20 and the arm element 21 about the axis 21c, an angle θ2 between the arm elements 21 and 22 about the axis 22c, and an angle θ3 between the arm elements 22 and 23 about the axis 23c are changed, whereby the arm distal end 2b can be moved to a desired position. Each servomotor is provided with an encoder 31 capable of detecting the angles θ1 to θ3 about the axes 21c to 23c described above. In the following description, angles (θ1(n), θ2(n), and θ3(n)) of the arm elements 21 to 23 set in the operation order n, i.e., in time series, are referred to as position information A of the arm elements 21 to 23 (see FIG. 4A).

The control unit 4 is provided with a setting unit 41 configured to set target position information received by the receiving unit 5 and current position information obtained by the encoder 31 as a start point and an end point of the arm distal end 2b, a track information storage unit 42 configured to store, as a database D, track information R of the arm distal end 2b generated in advance, and an operation command generation unit 43 configured to generate an operation command C to be output to the driving unit 3 in accordance with the track information R stored in the track information storage unit 42. Here, the receiving unit 5 receives target position information indicating a target position of the arm distal end 2b from a known manipulation unit, such as a display, a keyboard, and a mouse, or a higher-order system. This control unit 4 is constituted, for example, by an ordinary microprocessor provided with a CPU, a storage, and an interface. Programs necessary for processing are stored in the memory storage in advance. The CPU sequentially reads out and executes necessary programs to implement desired functions in cooperation with peripheral hardware resources. This control unit 4 generates the operation command C in consideration of, actually, actuator capability, such as torque, the number of rotation, the angle, and acceleration. Therefore, the operation command C may be corrected in accordance with the angles (θ1(n), θ2(n), and θ3(n)) of the arm elements 21 to 23 obtained from the encoder 31. The control unit 4 also has functions to register the track information R in the database D, and to read the track information R from the database D. A plurality of pieces of track information R are registered in the database D.

Here, regarding the track information R, appropriate track information of which moving time is the shortest among the track information derived based on the dynamics model and the constraints is generated using an optimization technique. Any known technique may be suitably used as the optimization technique and, for example, the technique disclosed in Japanese Laid-Open Patent Publication No. 2011-167827 may be used for the generation.

Figure 3:
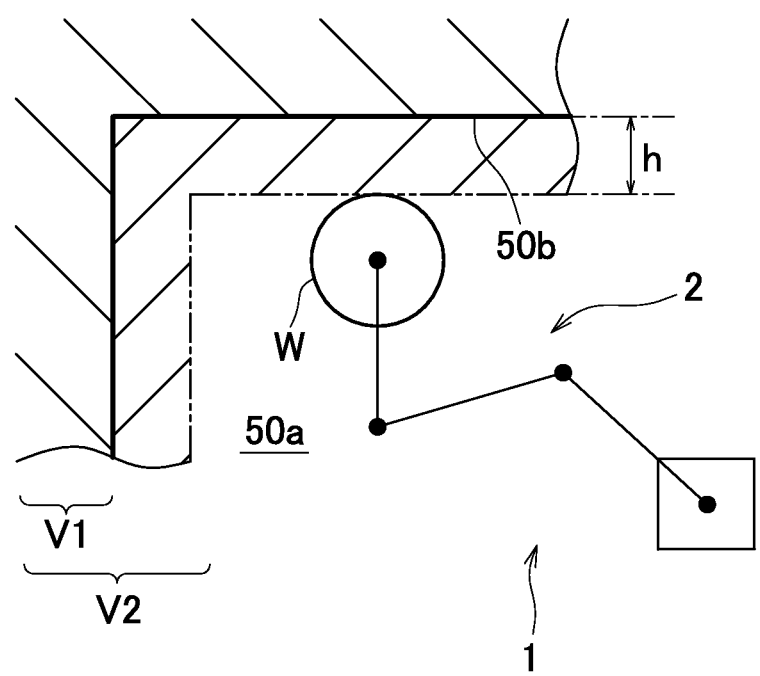
FIG. 3 is an explanatory view illustrating a moving area of an arm of the articulated robot.

In the present application, as illustrated in FIG. 3, as one of the constraints, an extension inhibited region V2 defined by extending an inhibited region V1 set by a wall 50b of the EFEM 50, the load ports 51 to 54, a load lock chamber 60 and the like inwardly, i.e., toward the conveying apparatus 1, by a predetermined distance h is set as a region into which the arm 2 and the wafer W held by the arm 2 cannot enter. This predetermined distance h is, for example, about 10 mm. Thus, since the track information R is generated with the wafer W held at the arm distal end 2b not entering the extension inhibited region V2 as one of the constraints, collision of the wafer W with obstacles, such as the wall 50b, can be prevented.

The thus generated track information R is constituted as a time series collection of the position information A described above (see FIG. 4A), and the track information storage unit 42 stores the track information R in correlation with combinations of the start points and the end points selected from the base points P0 to P5 that are destinations of the arm distal end 2b. In particular, as illustrated in FIG. 4B, track information R1 to R3, corresponding to (P0, P1), (P0, P2), (P1, P2), and the like are stored in the database D of the track information storage unit 42 as, for example, the combinations of (the start point, the end point). The track information R1 to R3, as the combinations of (the start point, the end point), also has a function as inverted track information Ri1 to Ri3 that is related track information Rr corresponding to (P1, P0), (P2, P0), and (P2, P1) having a predetermined relationship with (P0, P1), (P0, P2), and (P1, P2) described above. Thus, the database D does not need to separately hold track information R in a case where the combinations of (the start point, the end point) are (P1, P0), (P2, P0), and (P2, P1). Details about the inverted track information Ri will be described later.

The operation command generation unit 43 sequentially reads, from the track information R in the database D, the position information A of the arm elements 21 to 23 stored in the operation order for each control period and generates the operation command C under which each servomotor of the driving unit 3 is operated. The driving unit 3 having received the operation command C causes each servomotor of the driving unit 3 to move to form an angle of the position information A.

Figure 5:
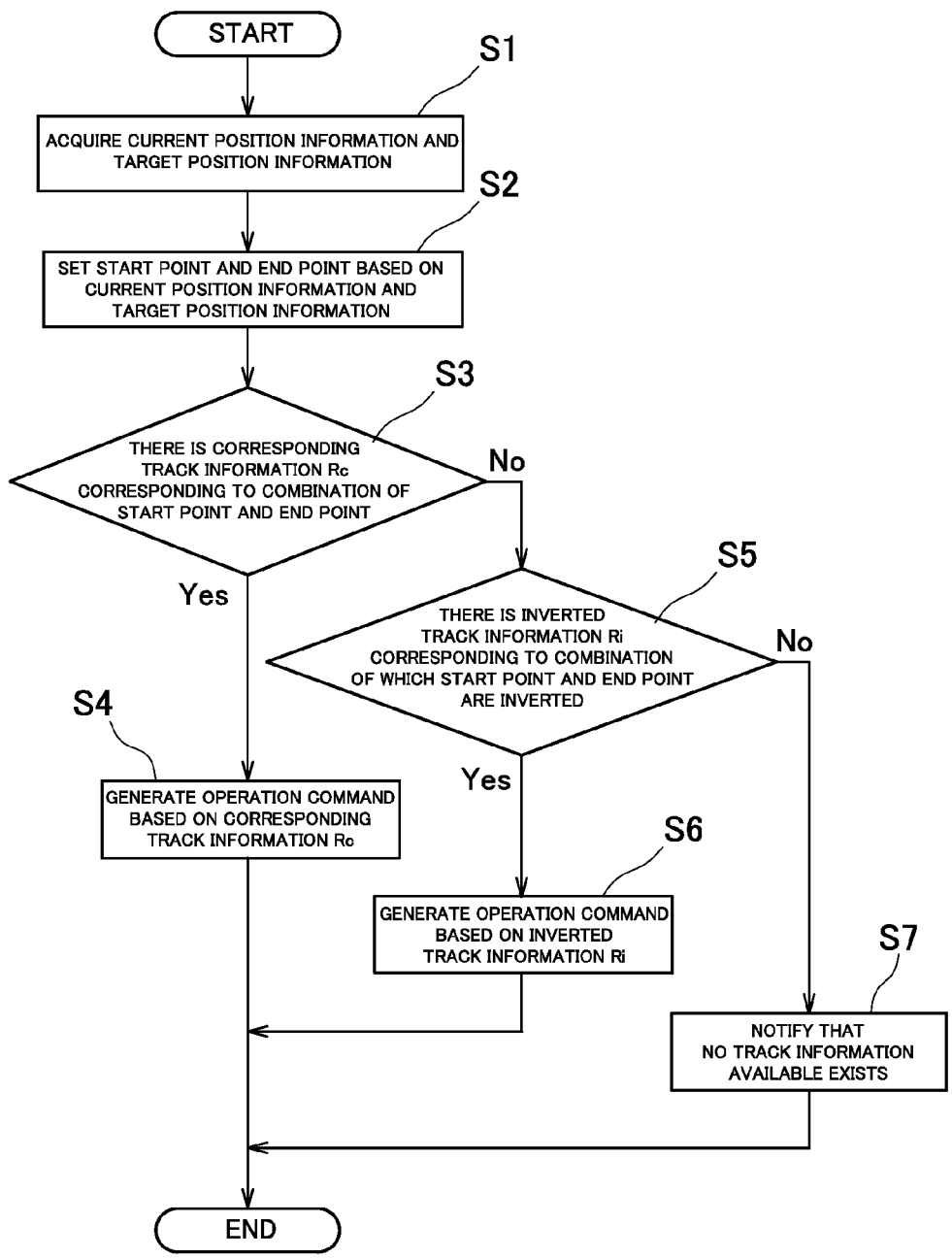
FIG. 5 is a flowchart illustrating a movement of the articulated robot.

Hereinafter, a generation process performed by the control unit 4 generating the operation command C from the target position information and the current position information is specifically described using the flowchart of FIG. 5 with reference to FIG. 1.

First, in step S1, the setting unit 41 acquires the current position information that is angles θ1 to θ3 of the current arm elements 21 to 23 from the encoder 31, and acquires the target position information from the receiving unit 5. Next, in step S2, the setting unit 41 sets a current position of the arm distal end 2b as the start point based on the current position information, and sets a target position of the arm distal end 2b as the end point based on the target position information.

Next, in step S3, the operation command generation unit 43 determines whether the track information R corresponding to the combination of the start point and the end point set by the setting unit 41 (hereafter, referred to as corresponding track information Rc) exists in the database D of the track information storage unit 42. If it is determined that the corresponding track information Rc exists in the database D of the track information storage unit 42, the process proceeds to step S4, where the operation command generation unit 43 generates the operation command C based on the corresponding track information Rc by reading the corresponding track information Rc from the database D.

If, on the other hand, it is determined that the corresponding track information Rc does not exist in the database D of the track information storage unit 42, the process proceeds to step S5, where the operation command generation unit 43 determines whether track information R corresponding to a combination of a start point and an end point that are inverted from those of the combination of the start point and the end point set by the setting unit 41 in step S2 (hereafter, referred to as inverted track information Ri) exists in the database D of the track information storage unit 42.

If it is determined that the inverted track information Ri in which the start point and the end point are inverted exists in the database D of the track information storage unit 42, the process proceeds to step S6, where the operation command generation unit 43 generates the operation command C by using the inverted track information Ri existing in the database D in inverted time series, i.e., by inversely reading. The inverted track information Ri is, for the reason described later, substantially identical to the corresponding track information Rc for moving the arm distal end 2b from the start point to the end point set by the setting unit 41 in inverted time series, which has not been able to be acquired because of being determined in step S3 not to exist in the database D.

If, on the other hand, the operation command generation unit 43 determines that the inverted track information Ri does not exist in the database D of the track information storage unit 42, the process proceeds to step S7, where the operation command generation unit 43 outputs a signal notifying that no track information R available exists in the database D. In this case, the conveying apparatus 1 notifies a user of the conveying apparatus 1 that the operation command C is ungenerable through a predetermined interface and stops the operation, or moves the arm 2 under a well-known real time control.

Figure 6A:
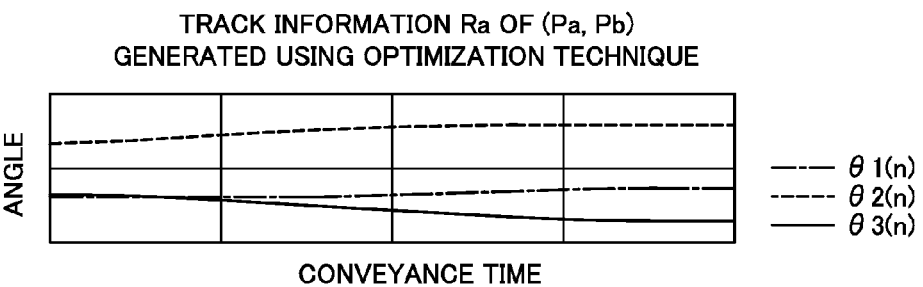
FIGS. 6A to 6C are graphs illustrating the track information of the articulated robot.
Figure 6B:
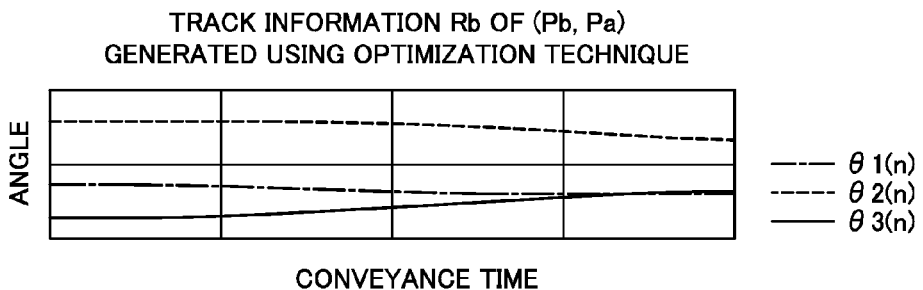
Figure 6C:
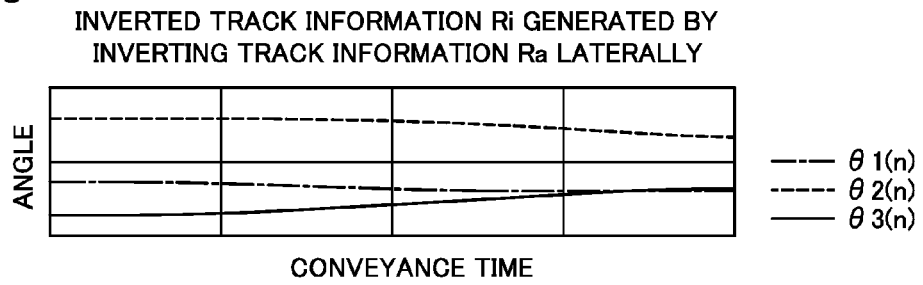

FIGS. 6A and 6B are normalized graphs showing results of calculation of, regarding certain two base points Pa and Pb of the arm distal end 2b, the angles $\theta 1(n)$ to $\theta 3(n)$ in time series about the axes 21c to 23c when the combination of (the start point, the end point) is denoted by (Pa, Pb) (track information Ra), and the angles $\theta 1(n)$ to $\theta 3(n)$ in time series about the axes 21c to 23c when the start point and the end point are inverted and the combination of (the start point, the end point) is denoted by (Pb, Pa) (track information Rb) respectively using an optimization technique. The graph of FIG. 6B showing the track information Rb and the graph of FIG. 6C, which is a laterally inverted graph of FIG. 6A, i.e., which is inverted in time series, are substantially superimposed on each other. That is, if the setting unit 41 sets the combination of (the start point, the end point) to be (Pb, Pa), the inverted track information Ri corresponding to this combination (Pa, Pb) in which the start point and the end point are inverted (see FIG. 6C) is substantially identical to the track information Rb (see FIG. 6B) calculated using the optimization technique. Therefore, an operation command C following an appropriate track can be generated without using the optimization technique.

The present inventors has so far confirmed that, regarding any combinations of the base points, graphs in inverted time series are substantially superimposed, and that, by using the inverted track information Ri corresponding to the combination of which the start point and the end point set by the setting unit 41 are inverted, substantially the same operation command C as that obtained through calculation is generable using the optimization technique. If the conveying apparatus 1 is operated in accordance with the operation command C generated based on the inverted track information Ri as the related track information Rr, there is a possibility that the conveying apparatus 1 departs somewhat from an appropriate track. In the present application, however, since the track information R is generated with the extension inhibited region V2 defined by extending, by the predetermined distance h, the inhibited region V1 into which entering of the arm 2 being inhibited as a constraint, collision of the arm 2 and the wafer W with obstacles, such as the wall 50b, due to the departure from the optimum track can be prevented.

As described above, the number of track information R to store in the database D of the track information storage unit 42 can be reduced by the control unit 4 generating the operation command C based on the inverted track information Ri in accordance with the target position information and the current position information. When, for example, three base points P0, P1, and P2, are set as the destinations of the arm distal end 2b, originally it is necessary to store 3!=6 combinations of track information R. In the present embodiment, however, as illustrated in FIG. 4B, an operation command C of a track of which combinations of (the start point, the end point) are (P1 P0), (P2, P0), and (P2 P1) is generable using the track information R1 to R3 as the inverted track information Ri(1, 0), Ri(2, 0), and Ri(2, 1) by storing only three combinations of track information R1 to R3 corresponding to (P0, P1), (P0, P2), and (P1, P2) (=corresponding track information Rc(0, 1), Rc(0, 2), and Rc(1, 2)) as the combinations of (the start point, the end point), whereby the number of the track information R to store can be reduced to ½ and the storage can be used efficiently. However, the number of the track information R to store is not necessarily reduced to ½, but may be increased or reduced depending on the storage capacity.

Of the first hand 23 and the second hand 24 having the same configuration, only the first hand 23 is described above. In the present embodiment, however, the track information R is shared by these hands 23 and 24 due to symmetric property of the first hand 23 and the second hand 24, and such sharing can also reduce the track information C to store in the track information storage unit 42.

As described above, the conveying apparatus 1, which is the articulated robot according to the present embodiment, is provided with an arm 2 constituted by a plurality of rotatably connected arm elements 21 to 23, and a control unit 4 configured to perform position control of the arm distal end 2b by outputting the operation command C to the driving unit 3 that drives the arm elements 21 to 23. The control unit 4 is provided with the track information storage unit 42 configured to store the track information R that corresponds to a combination of which any of the base points P0 to P5, which are a plurality of destinations to which the arm distal end 2b is moved, is set to be a start point and any other of the base points P0 to P5 is set to be an end point, and that includes the position information A of the arm elements 21 to 23 arranged in time series, the setting unit 41 configured to set the current position and the target position of the arm distal end 2b as the start point and the end point, and the operation command generation unit 43 configured to generate the operation command C based on the corresponding track information Rc that is the track information R corresponding to the combination of the start point and the end point set by the setting unit 41. In a case where the corresponding track information Rc is not stored but the related track information Rr corresponding to a combination of a start point and an end point having a predetermined relationship with the combination of the start point and the end point set by the setting unit 41 is stored in the track information storage unit 42, the operation command generation unit 43 generates the operation command C based on the related track information Rr.

With this configuration, the track information storage unit 42 stores the track information R that includes the position information A of the arm elements 21 to 23 set in time series, and the operation command generation unit 43 outputs the operation command C based on the track information R corresponding to the start point and the end point set by the setting unit 41 to perform position control of the arm distal end 2b. Therefore, if the track information R is prepared once, that information can be shared by the articulated robots of the same configuration, and thus adjustment of the relay point becomes unnecessary. Since the operation command C is generated from the track information R stored in the track information storage unit 42, real-time calculation, such as interpolating calculation of the relay point, becomes unnecessary, and an appropriate operation command C can be generated even by a low specification calculator. Further, a teaching operation necessary for the calculation of the conveyance path in real time can be reduced. In a case where the corresponding track information Rc is not stored but the related track information Rr is stored, the operation command C is generated based on the related track information Rr. Thus, the track information R to store in the track information storage unit 42 can be reduced, and position control of the arm distal end 2b can be performed without providing a large-capacity storage. Further, by reducing the track information R, more operation commands C can be generated using the storage of the same capacity. In addition, track calculation time necessary for deriving the track information R can be shortened.

The related track information Rr includes the inverted track information Ri that is the track information R corresponding to the combination of which the start point and the end point set by the setting unit 41 are inverted, and the operation command generation unit 43 is capable of generating the operation command C by using the inverted track information Ri in inverted time series. Therefore, the track information R to store in the track information storage unit 42 can be suitably reduced.

The conveying apparatus 1 is provided with the first hand 23 and the second hand 24, the first hand 23 and the second hand 24 as the arm elements are provided rotatably about the same rotation axis 23c on the arm base end 2a side, the control unit 4 performs position control of a first hand distal end 2b1 and a second hand distal end 2b2 that form the arm distal end 2b, and the operation command generation unit 43 generates the operation command C used to perform position control of the first hand distal end 2b1 and the second hand distal end 2b2 based on the track information R stored in the track information storage unit 42. Thus, the track information C to store in the track information storage unit 42 can be reduced.

When an effect of the conveying apparatus 1 described above is considered from an aspect as a method, the method for controlling the conveying apparatus 1 that is provided with the arm 2 constituted by a plurality of rotatably connected arm elements 21 to 23, the driving unit 3 that drives the arm elements 21 to 23, and the track information storage unit 42 that stores the track information R corresponding to a combination of which any of the base points P0 to P5, which are a plurality of destinations to which the arm distal end 2b is moved, is set to be a start point and any other of the base points P0 to P5 is set to be an end point, in which position control of the arm distal end 2b is performed by outputting the operation command C to the driving unit 3. The method includes: a step S2 of setting a start point and an end point based on the current position information and target position information; a step S3 of determining whether the corresponding track information Rc that is the track information R corresponding to a combination of the set start point and the set end point is stored in the track information storage unit 42; a step S4 of generating the operation command C based on the corresponding track information Rc if it is determined that the corresponding track information Rc exists in the track information storage unit 42; a step S5 of determining whether the related track information Rr corresponding to a combination of a start point and an end point having a predetermined relationship with the combination of the start point and the end point is stored in the track information storage unit 42 if it is determined that the corresponding track information Rc is not stored in the track information storage unit 42; and a step S6 of generating the operation command C based on the related track information Rr if it is determined that the related track information Rr is stored in the track information storage unit 42. By implementing such a method for controlling the conveying apparatus 1, the above-described effect can be produced.

Note that the specific configuration of each part is not limited to that of the embodiment described above.

For example, the conveying apparatus 1 in the above-described embodiment is installed at the center of the conveyance chamber 50a of the EFEM 50 as illustrated in FIG. 2 and, as described above, since the EFEM 50 is line symmetrical about the axis of symmetry L, which is parallel to the Y-axis and passing through the arm base end 2a (the base point P0) that is the center of rotation of the arm 2 of the conveying apparatus 1, and the base point P1 and a base point P4 and the base point P2 and a base point P3 of the load ports 51 to 54 are respectively symmetrical about the axis of symmetry L. Thus, the track information R to store in the track information storage unit 42 can also be reduced using the symmetric property of the track.

In particular, when the angles, as the position information A, of the arm elements 21 to 23 about the axes 21c to 23c in the operation order n are denoted by ($\theta1(n)$, $\theta2(n)$, and $\theta3(n)$), the position information symmetrical about the axis of symmetry L can be expressed as ($\pi-\theta1(n)$, $\pi-\theta2(n)$, and $\pi-\theta3(n)$) by symmetric transformation about a straight line $\theta=\pi/2$ as the axis of symmetry. Therefore, for example, even if the corresponding track information Rc that is the track information R corresponding to (P0, P4) set by the setting unit 41 as a combination of the start point and the end point does not exist in the database D of the track information storage unit 42, the track information R corresponding to the combination of (P0, P1) located at a position symmetrical about the axis of symmetry L can be set to be symmetry track information Rs that is related track information Rr regarding the combination of (P0, P4), and an operation command C that follows a track symmetrical to the track corresponding to (P0, P4) can be generated using the symmetry track information Rs.

As described above, the related track information Rr includes the symmetry track information Rs that is the track information corresponding to a combination of a start point and an end point located at symmetrical positions about the axis of symmetry L passing through the center of rotation of the arm 2 with respect to the start point and the end point set by the setting unit 41. Thus, if the operation command generation unit 43 is configured to be capable of generating the operation command C by using the symmetrically transformed position information of the symmetry track information Rs, the track information R to store in the track information storage unit 42 can be reduced.

The inverted track information Ri and the symmetry track information Rs may be combined as the related track information Rr. Thus, the number of track information R to store in the track information storage unit 42 can further be reduced to more than ½.

Although the position information A is expressed by the angles about the axes 21c to 23c of the arm elements 21 to 23 in the embodiment described above, the coordinates are not limited to the same: for example, the position information A may also be expressed by XY coordinates of the axes 21c to 23c. The track followed by the arm distal end 2b is not limited to that on the same plane, but the present invention may be applicable to an articulated robot that freely moves in a three-dimensional space.

Although the conveying apparatus 1 configured to convey the wafer W that is a conveyed material is assumed as the articulated robot in the above-described embodiment, the articulated robot is not limited to the conveying apparatus 1, but may be, for example, a machining apparatus or a welding machine.

Although the base points P0 to P5 are assumed as the predetermined destinations of the arm distal end 2b in the above-described embodiment, the base points that are the destinations are not limited to the same. For example, an aligner, a workstation, and the like may be provided as the base points at positions closer than the load ports. As described above, even if the number of the base points is increased, necessary track information R can be reduced.

The data generated in advance by the optimization technique is used as the track information R in the above-described embodiment. However, the track information R may be calculated by a computer on the robot at the time of setting the articulated robot. Alternatively, the robot may perform teaching, and the track information R may be generated by calculating by a computer on the robot using the data.

Various changes may be made to other configurations without departing from the spirit of the present invention.

What is claimed is:

1. An articulated robot comprising:
    an arm constituted by a plurality of rotatably connected arm elements; and
    a control unit configured to perform position control of an arm distal end by outputting an operation command to a driving unit that drives the arm elements,
    wherein the control unit includes
        a track information storage unit configured to store track information that corresponds to a combination of which any of a plurality of destinations to which the arm distal end is moved is set to be a start point and any other of the destinations is set to be an end point, and that includes position information of each of the arm elements arranged in time series,
        a setting unit configured to set a current position and a target position of the arm distal end as the start point and the end point, and
        an operation command generation unit configured to generate the operation command based on the track information corresponding to the combination of the start point and the end point set by the setting unit, and
    wherein, if the track information corresponding to the combination of the start point and the end point set by the setting unit is not stored but related track information corresponding to a combination of a start point and an end point having a predetermined relationship with the combination of the start point and the end point set by the setting unit is stored in the track information storage unit, the operation command generation unit generates the operation command based on the related track information.

2. The articulated robot according to claim 1, wherein the related track information includes inverted track information that is track information corresponding to a combination of which the start point and the end point set by the setting unit are inverted, and
    the operation command generation unit is capable of generating the operation command by using the inverted track information in inverted time series.

3. The articulated robot according to claim 1, wherein the related track information includes symmetry track information that is the track information corresponding to a combination of a start point and an end point located at symmetrical positions about a straight line passing through a center of rotation of the arm with respect to the start point and the end point set by the setting unit, and
    the operation command generation unit is capable of generating the operation command by using the symmetrically transformed position information of the symmetry track information.

4. The articulated robot according to claim 2, wherein the related track information includes symmetry track information that is the track information corresponding to a combination of a start point and an end point located at symmetrical positions about a straight line passing through a center of rotation of the arm with respect to the start point and the end point set by the setting unit, and
    the operation command generation unit is capable of generating the operation command by using the symmetrically transformed position information of the symmetry track information.

5. The articulated robot according to claim 1, wherein on the opposite side of the base end of the arm, a first hand and a second hand as the arm elements are provided rotatably about the same rotation axis,
    the control unit performs position control of a first hand distal end and a second hand distal end that form the arm distal end, and
    the operation command generation unit generates the operation command used to perform position control of the first hand distal end and the second hand distal end based on the track information stored in the track information storage unit.

6. The articulated robot according to claim 2, wherein on the opposite side of the base end of the arm, a first hand and a second hand as the arm elements are provided rotatably about the same rotation axis,
    the control unit performs position control of a first hand distal end and a second hand distal end that form the arm distal end, and
    the operation command generation unit generates the operation command used to perform position control of the first hand distal end and the second hand distal end based on the track information stored in the track information storage unit.

7. The articulated robot according to claim 3, wherein on the opposite side of the base end of the arm, a first hand and a second hand as the arm elements are provided rotatably about the same rotation axis,
    the control unit performs position control of a first hand distal end and a second hand distal end that form the arm distal end, and
    the operation command generation unit generates the operation command used to perform position control of the first hand distal end and the second hand distal end based on the track information stored in the track information storage unit.

8. The articulated robot according to claim 4, wherein on the opposite side of the base end of the arm, a first hand and a second hand as the arm elements are provided rotatably about the same rotation axis, the control unit performs position control of a first hand distal end and a second hand distal end that form the arm distal end, and the operation command generation unit generates the operation command used to perform position control of the first hand distal end and the second hand distal end based on the track information stored in the track information storage unit.

9. A method for controlling an articulated robot that includes an arm constituted by a plurality of rotatably connected arm elements, a driving unit configured to drive the arm elements, and a track information storage unit configured to store track information corresponding to a combination of which any of a plurality of destinations to which the arm distal end is moved is set to be a start point and any other of the destinations is set to be an end point, in which position control of the arm distal end is performed by outputting the operation command to the driving unit, the method comprising:

a step of setting a start point and an end point based on current position information and target position information;

a step of determining whether track information corresponding to the combination of the set start point and the set end point is stored in the track information storage unit;

a step of generating an operation command based on the track information if it is determined that the track information exists in the track information storage unit;

a step of determining whether related track information corresponding to a combination of a start point and an end point having a predetermined relationship with the combination of the start point and the end point is stored in the track information storage unit if it is determined that the track information is not stored in the track information storage unit; and a step of generating the operation command based on the related track information if it is determined that the related track information is stored in the track information storage unit.

* * * * *